United States Patent
Crippa et al.

(10) Patent No.: US 7,221,212 B2
(45) Date of Patent: May 22, 2007

(54) TRIMMING FUNCTIONAL PARAMETERS IN INTEGRATED CIRCUITS

(75) Inventors: Luca Crippa, Busnago (IT); Miriam Sangalli, Carugate (IT); Salvatrice Scommegna, Cornate d'Adda Fr. Porto (IT); Rino Micheloni, Turate (IT)

(73) Assignee: STMicroelectronics S.r.l., Agrate Brianaza (MI) (IT)

( * ) Notice: Subject to any disclaimer, the term of this patent is extended or adjusted under 35 U.S.C. 154(b) by 214 days.

(21) Appl. No.: 11/113,818

(22) Filed: Apr. 25, 2005

(65) Prior Publication Data

US 2005/0253644 A1 Nov. 17, 2005

(30) Foreign Application Priority Data

Apr. 26, 2004 (EP) .................. 04101718

(51) Int. Cl.
*G05F 1/10* (2006.01)
*G05F 3/02* (2006.01)

(52) U.S. Cl. ..................................... 327/540
(58) Field of Classification Search ........ 327/538–541, 327/543–544
See application file for complete search history.

(56) References Cited

U.S. PATENT DOCUMENTS

| 6,275,090 B1 | 8/2001 | Burger, Jr. et al. ......... 327/334 |
| 6,381,491 B1 | 4/2002 | Maile et al. .................... 607/2 |
| 6,446,593 B1 * | 9/2002 | Suganuma ............... 123/198 D |
| 6,501,256 B1 | 12/2002 | Jaussi et al. ................. 323/315 |
| 6,590,372 B1 | 7/2003 | Wiles, Jr. ..................... 323/316 |
| 6,621,284 B2 * | 9/2003 | D'Angelo ................... 324/763 |
| 6,992,911 B2 * | 1/2006 | Takahashi ................... 365/145 |

OTHER PUBLICATIONS

European Search Report for European Patent Application EP 04 10 1718, dated Nov. 5, 2004.

* cited by examiner

*Primary Examiner*—My-Trang Nu Ton
(74) *Attorney, Agent, or Firm*—Lisa K. Jorgenson; Jose Gutman; Fleit, Kain, Gibbons, Gutman, Bongini & Bianco P.L.

(57) ABSTRACT

A trimming structure for trimming functional parameters of an Integrated Circuit—IC—(100) includes a first (115*a*) and at least one second functional blocks (115*b*, . . . , 115*n*) with which a first (Vrg,a) and at least one second IC functional parameters (Vrg,b, . . . ,Vrg,n) are respectively associated. The trimming structure includes respective trimmable circuit structures (205*a*,210*a*, . . . ,205*n*,210*n*) included in the first and at least one second functional blocks, and trimming configuration storage (110) for storing trimming configurations for the trimmable circuit structures. A change in the trimming configuration of the first functional block causes a corresponding change in the trimming configuration of the second functional block. Further, a change in the second IC functional parameter in response to the corresponding change in the trimming configuration of the second functional block is proportional to the change in the first IC functional parameter consequent to the change in the trimming configuration of the first functional block.

24 Claims, 3 Drawing Sheets

TRIMMING FUNCTIONAL PARAMETERS IN INTEGRATED CIRCUITS

CROSS-REFERENCE TO RELATED APPLICATION

This application is based upon and claims priority from prior European Patent Application No. EP04101718.7, filed on 26 Apr. 2004, the entire disclosure of which is herein incorporated by reference.

BACKGROUND OF THE INVENTION

1. Field of the Invention

The present invention relates in general to the field of Integrated Circuits (ICs). Specifically, the invention concerns trimming methods, and related structures, adapted to allowing the implementation of functional parameters adjustment in ICs.

2. Description of the Related Art

Producing an IC is a very complex task, which involves several phases. In very general terms, starting for example from the IC architectural design, the different electronic circuits/circuit blocks are designed and simulated by means of CAD tools, then the physical layout of the several different IC layers is defined and the photolithographic masks necessary for the planar technology manufacturing process are fabricated. Once the masks are released, the IC is fabricated, and, at the end of the fabrication process, a testing phase checks whether the IC correctly performs the intended tasks, and satisfies the design requirements.

There are a number of functional parameters (voltages, currents, time delays, resistance and capacitance values) that, despite careful design and simulation of the different IC circuits/circuit blocks, are subject to deviations of their actual values compared to the intended, expected ones. This is mainly due to the practical, and, in some respects, even theoretical, impossibility of eliminating fluctuations in, e.g., the fabrication process parameters (e.g., dopant species concentrations, alignment of masks, and a number of other variables).

As a consequence to this unavoidable, statistical variations in the IC functional parameters, several of the produced IC samples might have to be discarded because they do not respect the intended specifications.

In order to avoid this, which could severely impact the manufacturing process yield, IC designers usually provide in the ICs trimming structures adapted to implement a post-manufacturing adjustment of at least the most critical IC functional parameters.

Several ways are possible for implementing the possibility of trimming the IC functional parameters, such as for example the provision of fuses, to be selectively burnt. A more usual and preferred way calls for providing within the IC memory registers, usually programmable electrically and capable of retaining the stored information even in absence of power supply. By storing in these register prescribed codes (configuration codes), different operating configurations for selected IC circuits/circuit blocks can be achieved, so as to adjust desired IC functional parameters; for this reason, these registers are also referred to as trimming configuration registers.

Typically, this kind of trimming is performed during the testing phase of the IC, and can be expediently exploited not only for ensuring that a specific IC satisfies the desired requirements, but also as an investigation means, for enabling the IC designer, and the process engineer, to refine the design, and the process flow with the aim of coming to a consolidated product.

The circuits/circuit blocks that are most frequently rendered trimmable include generators of voltages/currents, and particularly reference voltage/current generators/regulators.

A widely employed voltage reference is the so-called "bandgap" voltage reference generator, a per-se well-known circuit capable of furnishing a very stable voltage (the bandgap voltage), particularly in respect of temperature changes, a result that is achieved thanks to the fact that the changes in temperature in the base-emitter voltage ($V_{be}$) of a bipolar junction transistor are compensated by those of a voltage proportional to the thermal voltage ($V_T$).

Bandgap voltage reference generators are used for example in semiconductor memories, such as Flash memories, possibly in combination with on-chip voltage generators/regulators, for deriving the IC internal voltages necessary to perform the memory read, program and erase operations; in particular the bandgap voltage is used as a voltage reference for voltage regulators at the output of charge-pump voltage generators, for Voltage-Controlled Oscillators (VCO), for low-power supply detectors.

In a bandgap voltage reference generator the proportionality factor that determines the temperature compensation of the voltage $V_{be}$ is univocally determined by resistive ratios. Such resistive ratios, and thus the proportionality factor, are usually dimensioned in the IC design phase, based on models derived from measurements conducted on different manufactured wafer lots. Regretfully, the actual behavior of the bandgap reference voltage generator in the final IC, and particularly the dependence of the voltage $V_{be}$ on temperature, differs from the one forecasted, thus the bandgap voltage might suffer of more or less pronounced dependence on the temperature.

For this reason, the designers implement in the IC the possibility of varying, in the testing phase, the actual value of the proportionality factor, exploiting trimming configuration registers.

During the testing phase (a phase referred to in jargon as Electrical Wafer Sort—EWS), the bandgap voltage is measured at one of the pads of the IC, thanks to the activation of an N-channel pass MOSFET (intended to be kept off during the IC normal operation, by keeping its gate grounded) that connects the output of the bandgap reference voltage generator to the pad. Depending on the measured value, the proportionality factor is adjusted by varying the trimming configuration.

In several ICs, the bandgap reference voltage is exploited by a number of circuits/circuit blocks, particularly reference voltage/current generators/regulators. For example, in the case of a semiconductor memory IC, particularly an electrically programmable and erasable device such as a Flash memory, the bandgap reference voltage may be exploited for generating/regulating the voltages to be supplied to the wordline selectors, to the program load circuits, the sense amplifiers, the bulk electrodes of the memory cells, and the like.

Since varying the proportionality factor of the bandgap reference voltage generator also causes the bandgap reference voltage to change with respect to the value expected in the design phase, it becomes necessary to trim also the circuits/circuit blocks that exploit the bandgap reference voltage, particularly the voltage regulators: these need to be equipped with trimmable circuit structures. Configuration registers dedicated to trimming these other circuit blocks are thus provided for.

In the Applicant's opinion, the known implementations of the functional parameters trimming in ICs exhibit some problems.

A problem of the known solutions is that, being the trimmable circuit structures that exploit the bandgap reference voltage, namely the voltage regulators, normally uncorrelated from each other, it is necessary to trim each circuit block individually, with a significant waste of time. In particular, the IC testing time suffers from a significant impact due to the trimming of all the trimmable circuit structures.

Measuring the bandgap reference voltage value is also a source of other problems. The pass MOSFET that enables connecting the bandgap reference voltage output to the IC pad, should be kept off during the normal operation of the IC (in the designer's intentions, this should be ensured by the fact that the pass MOSFET gate is kept grounded). However, due to the presence of parasitic elements (e.g., inductances of the bonding leads that connect the IC pads to the IC package pins, parasitic inductances of the printed circuit board on which the IC is mounted, and the like), the voltage levels on the IC pads are far from ideal, and are affected by overshoots/undershoots over/below the supply voltage VDD/the reference voltage GND. If the voltage at the pad falls below the ground of an amount equal to or higher than the pass MOSFET threshold voltage, the pass MOSFET turns on, entering the saturation or even linear region, and current may be sunk from the output of the bandgap reference voltage generator.

Bandgap reference voltage generators are never designed to deliver output currents; the main objective in the design of bandgap reference voltage generators is the current consumption, which is kept as low as possible (e.g., less than 10 microamperes), so as to allow the bandgap reference voltage generators to be kept on even when the ICs are put in stand-by.

Thus, an even limited current absorption (e.g., 2 or 3 microamperes) from the bandgap reference voltage generator easily causes the bandgap voltage to fall from the intended value, to an extent that depends, among other factors, on the absorbed current, the voltage undershoot, the undershoot duration, the parasitic capacitance seen by the output node of the bandgap reference voltage generator.

For example, the Applicant has experimentally verified that the bandgap reference voltage may fall several tens of mV below the expected value (e.g., for an undershoot of approximately 1V, causing a current sink of approximately 200 microamperes, a fall of roughly 60 mV in the bandgap reference voltage has been observed), and a relatively long time (some hundreds of nanoseconds) is required for the bandgap voltage to return to the expected value.

A more or less direct consequence of the fluctuations in the bandgap reference voltage is that all the voltages that are in some way derived therefrom experience a corresponding fluctuation, but amplified by the voltage gain of the circuits used to derive them, and evolve in time following the bandgap reference voltage.

Furthermore, when the voltage at the IC pad goes negative, the bulk-drain PN junction of the pass MOSFET is forwardly biased, and thus a relatively high current (of the order of the milliampere) is sunk from the bulk; this causes an unnecessary and undesired current consumption, especially in stand-by or power-down modes.

An additional problem that the Applicant has observed relates to the propagation of disturbances at the IC pad to the output node of the bandgap reference voltage generator, through the source-drain parasitic capacitance of the pass MOSFET, and also the propagation of disturbances from the gate of the pass MOSFET, to the output of the bandgap voltage generator, through the gate-source parasitic capacitance thereof.

Dual problems are encountered in case a P-channel pass MOSFET is used, in substitution of the N-channel one: in this case, the problems derive from voltage overshoots at the IC pad. A CMOS pass-gate adds up the problems of an N-channel and a P-channel pass MOSFETs.

All these problems may greatly impair the correct functionality of the bandgap reference voltage generator and, as a consequence, of the whole IC.

Accordingly, there exists a need for overcoming the disadvantages of the prior art as discussed above.

SUMMARY OF THE INVENTION

In view of the state of the art outlined in the foregoing, it has been an object of the present invention to implement functional parameters trimming in an IC in a way that was less affected by the above-discussed problems.

According to an aspect of the present invention, the above and other objects are attained by means of a trimming structure for trimming functional parameters of an integrated circuit comprising a first and at least one second functional blocks with which a first and at least one second IC functional parameters are respectively associated, the trimming structure comprising: respective trimmable circuit structures included in the first and at least one second functional blocks, and trimming configuration storage means for storing trimming configurations for the trimmable circuit structures, wherein that the trimming configuration storage means is such that a change in the trimming configuration for the trimmable circuit structure of the first functional block causes a corresponding change in the trimming configuration for the trimmable circuit structure of the at least one second functional block; and the trimmable circuit structures are such that a change in the at least one second IC functional parameter in response to the corresponding change in the trimming configuration for the trimmable structure of the at least one second functional block is function of, particularly is proportional to the change in the first IC functional parameter consequent to the change in the trimming configuration for the trimmable circuit structure of the first functional block.

According to another aspect of the present invention, an IC trimming method is provided for trimming functional parameters of an IC, the IC comprising: a first and at least one second functional blocks, respectively associated with a first and at least one second functional parameters, depending on the first functional parameter, trimmable circuit structures provided in the first and in the at least one second functional blocks, for adjusting the first and at least one second functional parameters, and trimming configuration storage means for storing trimming configurations for the trimmable circuit structures in the first and in the at least one second functional blocks, and the method comprising: determining a trimming configuration for the trimmable circuit structure in the first functional block, the trimming configuration being adapted to causing a change in the first functional parameter, and storing the determined trimming configuration in the trimming configuration storage means; having the stored trimming configuration cause a corresponding change in a trimming configuration for the trimmable circuit structure in the at least one second functional block, the corresponding change causing a change in the second functional parameter function of, particularly proportional to the change in the first functional parameter.

BRIEF DESCRIPTION OF THE DRAWINGS

The features and advantages of the present invention will be made apparent by the following detailed description of an embodiment thereof, provided merely by way of non-limitative example, description that will be conducted making reference to the attached drawings, wherein.

DETAILED DESCRIPTION

Figure 1:
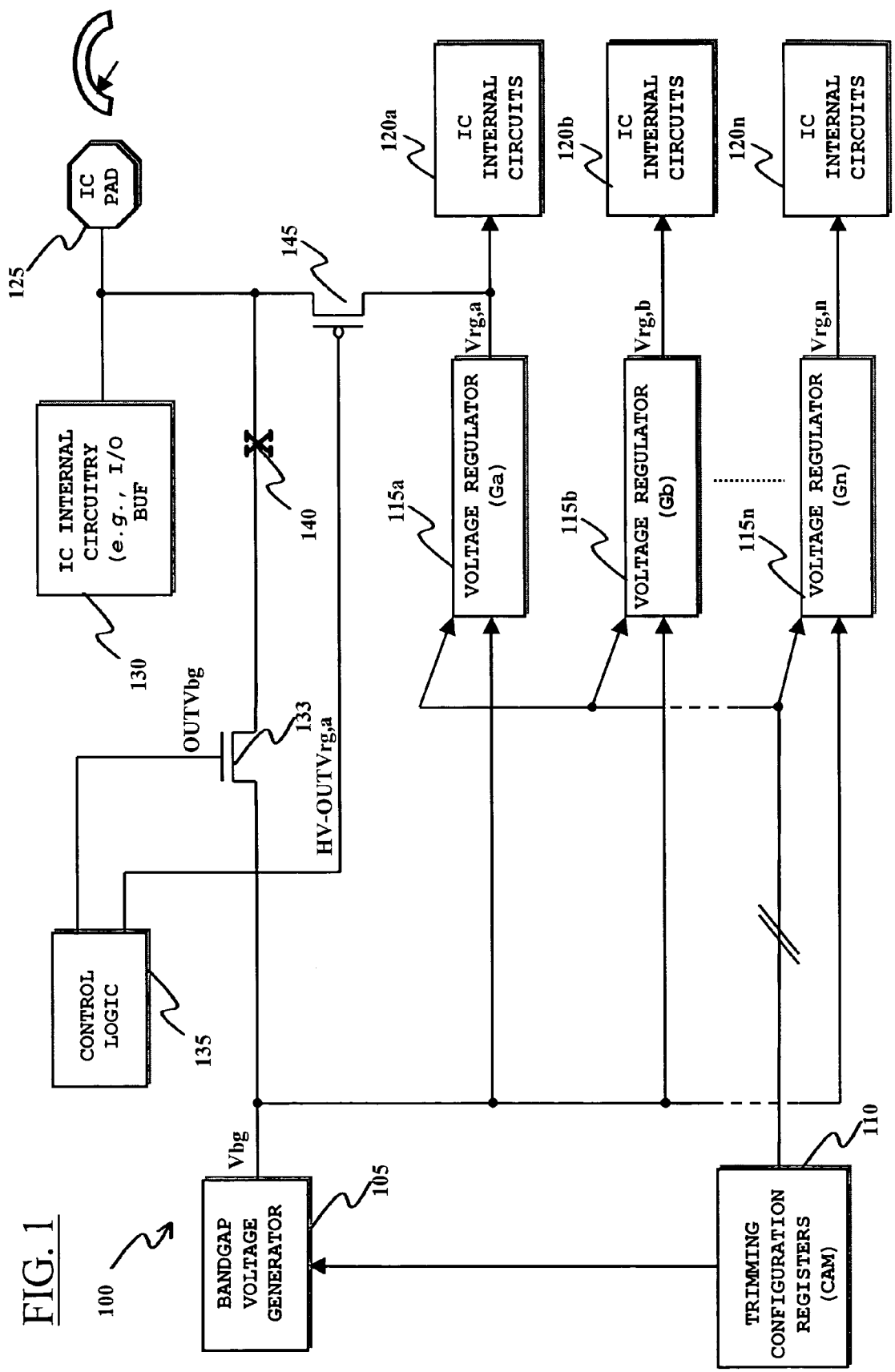
FIG. 1 shows schematically and in terms of functional blocks the components of a generic IC trimming structure according to an embodiment of the present invention.

Making reference to the drawings, FIG. 1 schematically shows, in a generic IC identified as 100, the functional blocks relevant to the understanding of the invention embodiment to be described.

In particular, reference numeral 105 identifies a bandgap reference voltage generator, of the type frequently used in ICs for generating a voltage (the bandgap voltage) Vbg, stable against variations in temperature, used within the IC as a reference voltage for, e.g., generating other voltages or currents, and/or regulating the generated voltages/currents.

The value Vbg of the bandgap voltage Vbg can be expressed as a function of the base-emitter voltage Vbe of a bipolar junction transistor, and of the thermal voltage $V_T$:

$$Vbg = Vbe + G*V_T,$$

where the value of the factor G determines the compensation in temperature of the voltage Vbe.

The detailed structure of the bandgap reference voltage generator 105 is not depicted in detail, being a circuit per-se well known in the art and, more important, not limitative for the present invention. As mentioned in the introductory part of the present description, the factor G is determined by resistive ratios, which are usually trimmable, and depends on a respective configuration stored in a dedicated configuration register. Such a configuration register is part of a set of trimming configuration registers, provided in the IC for trimming other circuit structures in addition to the bandgap reference voltage generator, and depicted in the drawing only schematically, by means of a block 110.

The bandgap voltage Vbg is supplied to a plurality of (two or more) circuits 115a, 115b, . . . , 115n, for example regulators of electrical quantities, particularly voltage regulators, which, based on the value of the bandgap voltage, exploited as a reference voltage, generate respective regulated voltages Vrg,a, Vrg,b, . . . , Vrg,n, to be used by respective IC circuit blocks 120a, 120b, . . . , 120n. The IC circuit blocks 120a, 120b, . . . , 120n may be the most disparate in nature, and depend for example on the particular IC under consideration. For example, in the case of a semiconductor memory IC, particularly an electrically programmable and erasable device such as a Flash memory, one of the IC circuit blocks, e.g. the circuit block 120a, may be the memory wordline selector, which is the circuit that selects the wordlines of memory cells and brings the selected wordlines to suitable electric potentials, depending on the operation to be performed (e.g., 5V in reading, 8–9V in programming, −8 or −9V in erase); the regulated voltage Vrg,a is in this case an output of one or more regulated charge-pump voltage boosters, generating the different voltages required for the different operations to be performed; still considering the exemplary case of a Flash memory, other circuit blocks that may necessitate of a regulated voltage are the wordline drivers, the program load circuits and the memory cell drain voltage regulators, the regulators for the memory cells' bulk electrode voltage (especially in program mode), the sense amplifiers, the power-on reset circuit.

The voltage regulators 115a, 115b, . . . , 115n are characterized by respective gains Ga, Gb, . . . , Gn, which determine the value Vrg,a, Vrg,b, . . . , Vrg,n of the regulated voltages Vrg,a, Vrg,b, . . . , Vrg,n, based on the value Vbg of the bandgap voltage Vbg.

Figure 2:
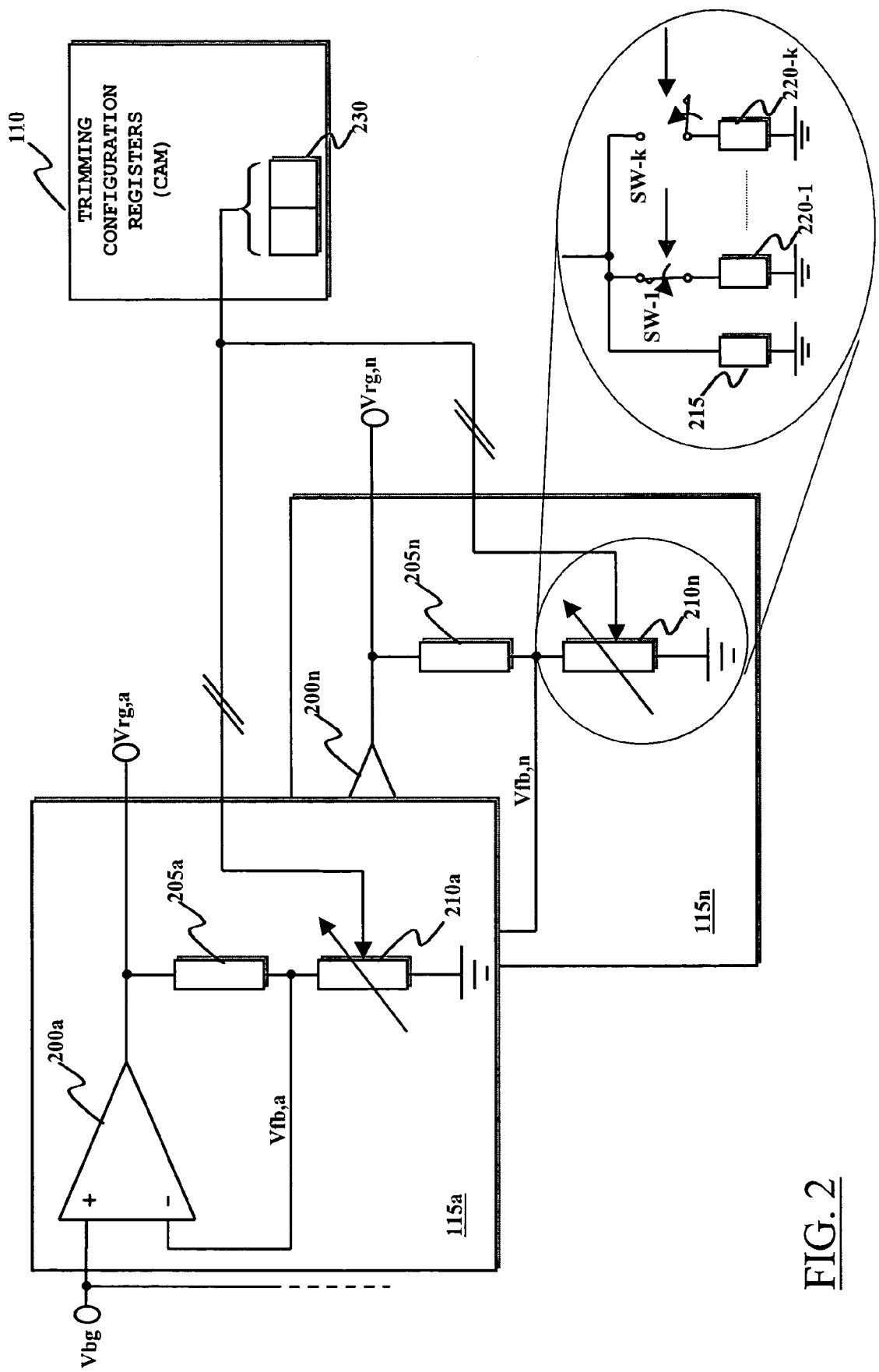
FIG. 2 shows, still schematically but in greater detail, the structure of some of the blocks of FIG. 1.

In very general terms, the structure of the voltage regulators 115a, 115b, . . . , 115n can be schematized as in FIG. 2 (it is however pointed out that the peculiar structure of the voltage regulators is not limitative to the present invention, and different circuit configurations can be envisaged). In the generic voltage regulator, a differential amplifier 200a, . . . , 200n, of sufficiently high gain, receives the bandgap voltage Vbg at one input terminal thereof, particularly a non-inverting input terminal, identified in the drawing as "+". An output of the differential amplifier 200a, . . . , 200n provides the regulated voltage Vrg,a, . . . , Vrg,n. A feedback signal, particularly a feedback voltage Vfb,a, . . . , Vfb,n is derived from the regulated voltage Vrg,a, . . . , Vrg,n, by means of a feedback network, and is fed to the other input terminal of the differential amplifier 200a, . . . , 200n, particularly the non-inverting input terminal, identified in the drawing as "−". The feedback network includes a voltage partition network, comprising a series connection of a first and a second impedance elements 205a and 210a, . . . , 205n and 210n, particularly, albeit not limitatively, resistors or resistor arrangements, connected between the output of the differential amplifier 200a, . . . , 200n and the ground; the feedback voltage Vfb,a, . . . , Vfb,n is tapped off the intermediate node of the a first and a second impedance elements 205a and 210a, . . . , 205n and 210n.

The gains of the voltage regulators 115a, 115b, . . . , 115n are determined by impedance ratios. Supposing that the impedance elements 205a and 210a, . . . , 205n and 210n are resistors, having resistance values R1,a and R2,a, . . . , R1,n and R2,n, the gains of the voltage regulators are:

$$Ga = [1 + (R1,a/R2,a)]$$
$$\vdots$$
$$Gn = [1 + (R1,n/R2,n)]$$

and the regulated voltage values are:

$$Vrg, a = Ga * Vbg$$
$$\vdots$$
$$Vrg, n = Gn * Vbg$$

It is observed that, in this way, the gains of the voltage regulators are rendered substantially independent from variations of IC manufacturing process parameters, even if the individual resistance values vary significantly from lot to lot of manufactured ICs.

The voltage regulators 115a, 115b, ..., 115n are trimmable, i.e. the gain Ga, ..., Gn of the generic voltage regulator 115a, 115b, ..., 115n can be adjusted after the IC manufacturing. In particular, and by way of example only, the regulator gain adjustment is accomplished varying the impedance of at least one of the impedance elements 205a and 210a, ..., 205n and 210n, for example the resistance value R2,a, ..., R2,n of the resistive element 210a, ..., 210n. For example, as schematically shown in FIG. 2, the generic resistive element 210a, ..., 210n may include a parallel arrangement of a plurality of (at least two) resistors, one resistor 215 being permanently connected in series to the resistive element 205a, ..., 205n, while the remaining resistors 220-1, ..., 220-k are selectively connectable in parallel to the resistor 215, by means of respective controlled switches SW1, ..., SWk. Thus, by connecting in parallel to the resistor 215 a selected number of additional resistors 220-1, ..., 220-k, the overall resistance of the resistive element 210a, ..., 210n can be varied (the finer the higher the number of additional resistors), and thus the voltage regulator gain Ga, ..., Gn can be varied, with the consequence that the value Vrg,a, ..., Vrg,n of the regulated voltage Vrg,a, ..., Vrg,n is adjusted to the desired value.

Considering the generic voltage regulator 115a, 115b, ..., 115n, the open/closed configuration of the switches SW1, ..., SWk is determined by a (digital) value stored in a trimming configuration register (the register 230 shown in FIG. 2), included in the block 110. For example, in case the additional resistors 220-1, ..., 220-k are two, a two-bit register is sufficient in order to store a desired trimming configuration for the generic voltage regulator: each bit in the configuration register controls the open/closed status of one respective switch SW1, ..., SWk.

In the practice, the trimming configuration registers may be implemented as a Content Addressable Memory (a CAM), of the type exploited e.g. in semiconductor memories with redundancy for storing the addresses of the defective storage resources for redundancy purposes.

Referring back to FIG. 1, in an embodiment of the present invention the output Vbg of the bandgap reference voltage generator 105 is connectable to a generic pad 125 of the IC, connected to an IC internal circuitry, generically depicted as a block 130, including circuit elements such as input or input/output buffers). The connection of the bandgap reference voltage generator output Vbg to the pad 125, enabling the measurement of the bandgap voltage value Vbg from outside the IC, is accomplished by a switch element in the form of a pass MOSFET 133, e.g. an N-channel MOSFET, controlled by a signal OUTVbg, provided for example by an IC control logic, depicted schematically as a block 135, and an element, identified in the drawing by 140, adapted to ensuring electrical connection and that can be selectively and controllably removed, so as to interrupt and render impossible the otherwise potentially establishable connection of the bandgap reference voltage generator output Vbg to the pad 125, such as a fuse that can be burnt, or a so-called metal option at the level of the photolithographic mask used for patterning the IC metal interconnection layer (the metal option involving the provision of two such masks, slightly differing from one another, one in which the connection is present, the other one in which the connection is absent), or even an option at the level of other photolithographic masks, for example the mask used for patterning the polysilicon layer forming the gate of the MOSFETs (and thus the gate of the pass MOSFET 133), or the mask used for defining the MOSFETs' source and drain regions, and the like.

Additionally, in an embodiment of the present invention, the output Vrg,a of one of the voltage regulators, in the example the voltage regulator 115a, is connectable to the IC pad 125 (which, in general, may be a different pad with respect to the pad at which the bandgap reference voltage generator output Vbg is connectable), so as to enable direct measurement of the value Vrg,a of the regulated voltage Vrg,a; also in this case, the connection is accomplished by means of a switch element, in the form of a P-channel MOSFET 145, preferably of the type capable of sustaining relatively high voltages, controlled by a signal HV-OUTVrg, a, provided by the IC control logic 135.

Conventionally, a generic trimmable structure in the IC, such as, in the example herein considered, one of the feedback networks 205a and 210a, ..., 205n and 210n in the voltage regulators 115a, ..., 115n, is not correlated to the other trimmable structures existent in the IC. This leads for example to the problems evidenced in the introductory part of the present description, that each circuit block needs to be trimmed individually, with a significant waste of time. In particular, the IC testing time suffers from a significant impact due to the trimming of all the trimmable circuit structures.

According to an embodiment of the present invention, the voltage regulators 115a, ..., 115n, and particularly the feedback networks 205a and 210a, ..., 205n and 210n, constituting trimmable structures, are such that the voltage regulator gains Ga, ..., Gn vary in a known way, e.g. linearly with the trimming configuration, stored in the trimming configuration registers 110, and a change in the trimming configuration of one of the voltage regulators, e.g. the regulator 115a, causes a corresponding change in the trimming configurations of the other voltage regulators 115b, ..., 115n (in particular, but not limitatively, the trimming configuration stored in the CAM may be unique for all the voltage regulators 115a, ..., 115n; for example, a single register 230 is exploited). In other words, this means that if, for a change in the trimming configuration, defined by the configuration registers 110, from a first configuration, CFG1, to a second configuration, CFG2, the gain of one of the voltage regulators, e.g. the gain Ga of the voltage regulator 115a, experiences a certain variation, e.g. a +10% change, a correspondent, for example a substantially similar, +10% variation is experienced, for the corresponding (particularly, the same) trimming configuration change, by the gains Gb, ..., Gn of the remaining voltage regulators 115b, ..., 115n. Still differently stated, the ratio (Gh/Gi) of the gains Gh and Gi of two generic voltage regulators of the voltage regulators 115a, 115b, ..., 115n remains substantially constant irrespective of the trimming configuration stored in the trimming configuration registers 110.

Let it be assumed, for the sake of description simplicity, that four different trimming configurations are possible for the trimmable structures, in the example herein considered represented by the feedback networks 205a and 210a, ..., 205n and 210n, the four trimming configurations corresponding to four different possible values Vrg,a, ..., Vrg,n for the regulated voltages Vrg,a, ..., Vrg,n; this means for example that the generic resistive element 210a, ..., 210n includes the resistor 215 and, in parallel thereto, two additional resistors, selectively connectable depending on the open/closed status of the respective switch, stored in a two-bit register 230 (which, in an embodiment of the present invention, is common to all the trimmable structures, i.e. common to all the voltage regulators).

The voltage regulators 115a, ..., 115n exhibit, for each trimming configuration, a respective gain, as shown in the following table:

| Voltage regulator | Trimming configuration | | | |
|---|---|---|---|---|
| | "11" | "10" | "01" | "00" |
| 115a | Ga, 1 | Ga, 2 | Ga, 3 | Ga, 4 |
| 115b | Gb, 1 | Gb, 2 | Gb, 3 | Gb, 4 |
| 115n | Gn, 1 | Gn, 2 | Gn, 3 | Gn, 4 |

Let the generic trimming configuration be denoted by the value of an index p, with p ranging from 1 to 4.

The condition set forth above can be concisely expressed as:

$$G_{q,p}/G_{r,p} = Cost_{qr}$$

where q and r are two indexes ranging from a to n, with q different from r, and $Cost_{qr}$ is a predetermined constant.

A trimming procedure according to an embodiment of the present will now be described.

The actual value Vbg of the bandgap reference voltage Vbg generated by the bandgap voltage generator 105 is measured at least once, or a limited number of times, during the post-manufacturing testing of an IC (a limited number of ICs) belonging to the first production lots (these ICs normally serve for qualification, debugging, manufacturing process trimming purposes only, and are normally not sold). To this purpose, the MOSFET 133 is turned on, thereby connecting the output of the bandgap reference voltage generator 105 to the IC pad 125.

The measured value Vbg is compared to a target value, and, if required (as it normally is) the value of the parameter G of the bandgap reference voltage generator is adjusted by acting on the trimming structure provided in the bandgap reference voltage generator, so as to bring the measured value Vbg as close as possible to the target value; the configuration is then stored in the trimming configuration register relating to the bandgap reference voltage generator.

In subsequent IC production lots, the electrical connection between the bandgap reference voltage output and the IC pad is removed, for example the element 140 is burnt at the IC testing level, or the slightly-modified metal mask is used for the manufacturing of the subsequent IC production lots. In this way, it is ensured that the bandgap reference voltage generator is isolated from the IC pad, and does not suffer from the problems discussed in the introductory part of this description.

During the testing of the ICs belonging to these subsequent IC production lots, the regulated voltage at the output of one of the voltage regulators is measured, instead of directly measuring the output voltage of the bandgap reference voltage generator; referring to the example shown in the drawings, the value Vrg,a of the regulated voltage Vrg,a generated by the voltage regulator 115a is measured, by connecting the output Vrg,a of the voltage regulator to the IC pad 125; to this purpose, the MOSFET 145 is turned on, by bringing the voltage of the signal HV-OUTVrg,a to the ground (such a signal is normally kept at a voltage sufficiently high, compared to the IC supply voltage, so that the MOSFET 145 remains off even in case of voltage undershoots at the IC pad). In principle, the choice of which voltage regulator to elect for measuring the regulated voltage is completely free to the designer, albeit it might be recommendable to measure the output voltage of the voltage regulator that, for different and possibly contingent reasons, is considered more critical; for example, in the case of a memory device IC, a good choice might be to measure the output voltage of the voltage regulator that feeds the wordline selector, and particularly the voltage regulator generating the voltage used for biasing the selected wordline during a read operation.

The measured value Vrg,a is compared to a target value, and, if required (as it normally is) the voltage regulator gain Ga is trimmed; to this purpose, the value stored in the trimming configuration register 230 is changed, e.g. from the initial value "10" to the value "01", so as to vary the gain value, for example from Ga,2 to Ga,3, and bring the measured Vrg,a as close as possible to the target value.

Thanks to the (linear) relationship that exists between the configuration value stored in the trimming configuration register 230 and the gains of the voltage regulators, the trimming configuration change made for adjusting the value Vrg,a of the regulated voltage Vrg,a causes a proportionally equal change in the gains of the other voltage regulators 115b, ..., 115n, so that their output voltages Vrg,b, ..., Vrg,n automatically center at the respective target values.

After having configured the trimming configuration register 230, the MOSFET 145 is turned off, and the testing proceeds with other tests.

It can be appreciated that in this way the problems related to the necessity of connecting the output of the bandgap reference voltage regulator to an IC pad are overcome. In fact, exception made for a limited number of ICs belonging to the first production lots (which, as mentioned, are normally not sold, and serves merely for testing purposes), the bandgap reference voltage generator is completely isolated from the IC pads, because it is not necessary to measure the bandgap reference voltage; instead, a voltage derived therefrom, particularly a regulated voltage is measured, generated by one of the voltage regulators integrated in the IC; it is observed that a voltage regulator is a circuit normally more robust than the bandgap reference voltage generator, and capable of sustaining a sink of current without great problems (on the other hand, a voltage regulator, differently from a bandgap reference voltage generator, is a circuit intended to deliver current).

In particular, a careful choice of the voltage regulator to be measured may be of help, for example it would be advisable to choose the regulator that normally sees a significant output load, as in the case of the regulator feeding the wordline selector in a memory device, because in this case the measurement is scarcely affected by disturbs.

Thanks to the (linear) relationship between trimming configuration and values of the quantities generated by the trimmable structures, in the above example the gains of the voltage regulators, it is sufficient to measure just one of these quantity (in the present example, the value of the regulated voltage Vrg,a) and adjust this quantity; the remaining quantities will be automatically adjusted. This translates into a significant save of testing time.

Additionally, only one voltage regulator needs in this way to be connected to an IC pad, so that possible disturbs injected into the output of such a voltage regulator do not affect the remaining regulators. In any case, the use of the properly-driven high-voltage P-channel MOSFET as a pass transistor for connecting the output of the regulator to the IC pad ensures that overshoots and undershoots in the voltage at the pad do not accidentally turn on the MOSFET, because the pass MOSFET is kept strongly off by a relatively high gate voltage (e.g., 8 to 9 V), which a voltage overshoot at the pad is not sufficient to overcome.

Figure 3:
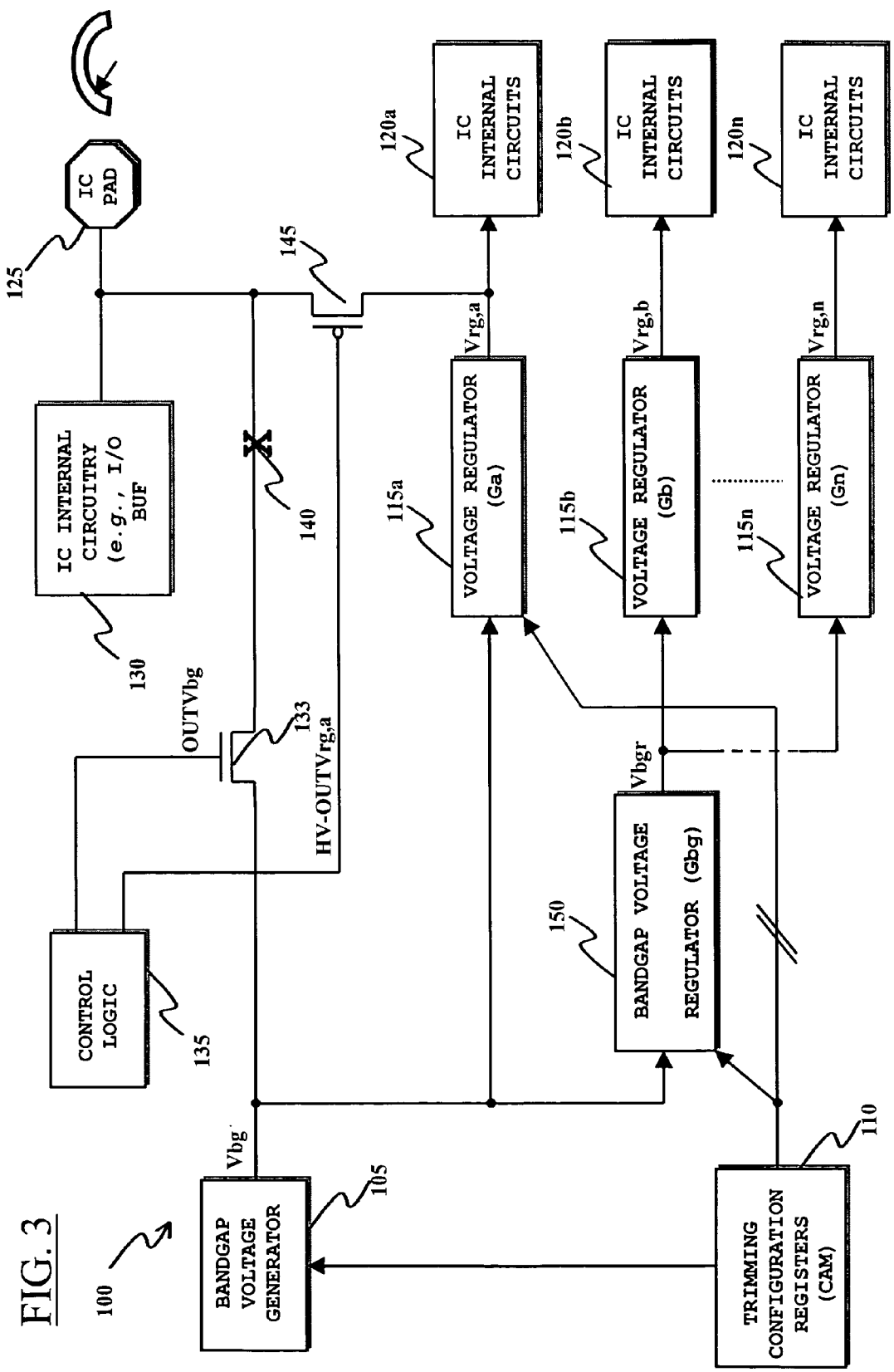
FIG. 3 shows, in a way similar to FIG. 1, a trimming structure according to an alternative embodiment of the present invention.

In FIG. 3 there is schematically depicted an alternative embodiment of the present invention, in which a bandgap voltage regulator 150 is provided, receiving the bandgap reference voltage Vbg, and providing at an output thereof a regulated bandgap reference voltage Vbgr, which is then fed to the voltage regulators 115b, . . . , 115n (instead of directly feeding the bandgap reference voltage Vbg).

Compared to the previously described embodiment, trimming structures are in this case only needed for trimming the (gain of the) voltage regulator 115a and the (gain Gbg of the) bandgap voltage regulator 150, while no trimming structures need in principle to be provided in each of the voltage regulators 115b, . . . , 115bn (a trimming structure for trimming the factor G of the bandgap reference voltage generator is of course needed also in this case, for adjusting the factor G). The trimming procedure may be similar to the previously described one.

Another possible alternative solution would be to have the bandgap voltage regulator 150 feed all the voltage regulators 115a, . . . , 115n, without the necessity of providing a trimming structure in one of the regulators (in the example, the regulator 115a).

It is pointed out that albeit described making reference to a bandgap reference voltage generator and to voltage regulators, this is not to be construed as a limitation to the possibility of applications of the present invention, which instead applies in general to any characteristic electrical quantity in an integrated circuit, and to the trimming of circuits different from voltage regulators.

While there has been illustrated and described what is presently considered to be embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A trimming structure for trimming functional parameters of an Integrated Circuit (IC) comprising a first and at least one second functional blocks with which a first and at least one second IC functional parameters are respectively associated, the trimming structure comprising:

respective trimmable circuit structures included in the first and at least one second functional blocks, and trimming configuration storage means for storing trimming configurations for the trimmable circuit structures, and wherein that the trimming configuration storage means is such that a change in the trimming configuration for the trimmable circuit structure of the first functional block causes a corresponding change in the trimming configuration for the trimmable circuit structure of the at least one second functional block; and the trimmable circuit structures are such that a change in the at least one second IC functional parameter in response to the corresponding change in the trimming configuration for the trimmable structure of the at least one second functional block is function of, particularly is proportional to the change in the first IC functional parameter consequent to the change in the trimming configuration for the trimmable circuit structure of the first functional block.

2. The IC trimming structure according to claim 1, wherein the trimming configuration for the trimmable circuit structure of the first functional block stored in the trimming configuration storage means also constitutes the trimming configuration of the trimmable circuit structure of the at least one second functional block.

3. The IC trimming structure according to claim 1, wherein an access path to the first IC functional parameter from outside the IC is provided, selectively activatable at least in an IC testing phase for allowing measuring the first functional parameter.

4. The IC trimming structure according to claim 1, wherein the functional blocks are generators/regulators of electrical quantities, particularly voltage/current generators/regulators.

5. The IC trimming structure according to claim 4, wherein the trimmable circuit structures include voltage/current partitioners with adjustable partition ratios.

6. The IC trimming structure according to claim 1, wherein the first and the at least one second functional parameters are sensitive to a reference functional parameter, particularly a reference electrical quantity generated by a reference functional parameter generator in the IC and fed to the first and the at least one second functional blocks.

7. The IC trimming structure according to claim 6, comprising means for interrupting an access path to the reference functional parameter from outside the IC.

8. The IC trimming structure according to claim 7, wherein the means for interrupting the access path includes a physical interruption in the access path to the reference functional parameter from outside the IC.

9. The IC trimming structure according to claim 6, wherein the reference functional parameter generator includes a respective trimmable structure for trimming the reference functional parameter based on a trimming configuration stored in the trimming configuration storage means.

10. A method of trimming functional parameters of an Integrated Circuit—(IC) under trimming, the IC comprising:

a first and at least one second functional blocks, respectively associated with a first and at least one second functional parameters, depending on the first functional parameter, trimmable circuit structures provided in the first and in the at least one second functional blocks, for adjusting the first and at least one second functional parameters, and trimming configuration storage means for storing trimming configurations for the trimmable circuit structures in the first and in the at least one second functional blocks, and the method comprising:

determining a trimming configuration for the trimmable circuit structure in the first functional block, the trimming configuration being adapted to causing a change in the first functional parameter, and storing the determined trimming configuration in the trimming configuration storage means; and having the stored trimming configuration cause a corresponding change in a trimming configuration for the trimmable circuit structure in the at least one second functional block, the corresponding change causing a change in the second functional parameter function of, particularly proportional to the change in the first functional parameter.

11. The method according to claim 10, wherein the determining a trimming configuration for the trimmable circuit structure in the first functional block comprises accessing and measuring the first functional parameter.

12. The method according to claim 11, wherein the IC further comprises a trimmable reference functional block, associated with a reference functional parameter to which the first and the at least one second functional parameters are sensitive, the method further comprising:
having a pre-determined trimming configuration for the reference functional block stored in the storage means.

13. The method according to claim 12, wherein the storing a pre-determined trimming configuration for the trimmable reference functional block comprises:
in an IC other than the IC under trimming, providing an access path to the reference functional block from outside the IC, so as to measure the reference functional parameter, and providing the access path with an interruption in the IC under trimming.

14. An integrated circuit (IC), comprising:
a circuit supporting substrate;
circuitry disposed on the circuit supporting substrate; and
a trimming structure, disposed on the circuit supporting substrate, for trimming functional parameters of the integrated circuit comprising a first and at least one second functional blocks with which a first and at least one second IC functional parameters are respectively associated, the trimming structure comprising:
respective trimmable circuit structures included in the first and at least one second functional blocks, and
trimming configuration storage means for storing trimming configurations for the trimmable circuit structures, and
wherein that the trimming configuration storage means is such that a change in the trimming configuration for the trimmable circuit structure of the first functional block causes a corresponding change in the trimming configuration for the trimmable circuit structure of the at least one second functional block; and
the trimmable circuit structures are such that a change in the at least one second IC functional parameter in response to the corresponding change in the trimming configuration for the trimmable structure of the at least one second functional block is function of, particularly is proportional to the change in the first IC functional parameter consequent to the change in the trimming configuration for the trimmable circuit structure of the first functional block.

15. The integrated circuit of claim 14, wherein the trimming configuration for the trimmable circuit structure of the first functional block stored in the trimming configuration storage means also constitutes the trimming configuration of the trimmable circuit structure of the at least one second functional block.

16. The integrated circuit of claim 14, wherein an access path to the first IC functional parameter from outside the IC is provided, selectively activatable at least in an IC testing phase for allowing measuring the first functional parameter.

17. The integrated circuit of claim 14, wherein the functional blocks comprise generators/regulators of electrical quantities, particularly voltage/current generators/regulators.

18. The integrated circuit of claim 14, wherein the trimmable circuit structures include voltage/current partitioners with adjustable partition ratios.

19. The integrated circuit of claim 14, wherein the first and the at least one second functional parameters are sensitive to a reference functional parameter, particularly a reference electrical quantity generated by a reference functional parameter generator in the integrated circuit and fed to the first and the at least one second functional blocks.

20. The integrated circuit of claim 19, comprising means for interrupting an access path to the reference functional parameter from outside the IC.

21. The integrated circuit of claim 20, wherein the means for interrupting the access path includes a physical interruption in the access path to the reference functional parameter from outside the integrated circuit.

22. The integrated circuit of claim 19, wherein the reference functional parameter generator includes a respective trimmable structure for trimming the reference functional parameter based on a trimming configuration stored in the trimming configuration storage means.

23. The integrated circuit of claim 14, wherein the integrated circuit comprises at least one semiconductor memory device.

24. The integrated circuit of claim 23, wherein the at least one semiconductor memory device comprises Flash memory.

* * * * *